United States Patent [19]
Yui et al.

[11] Patent Number: 5,892,359
[45] Date of Patent: Apr. 6, 1999

[54] GRADIENT COIL APPARATUS AND MAGNETIC RESONANCE IMAGING APPARATUS

[75] Inventors: Masao Yui, Kawasaki; Kiyomi Mori, Otawara; Arturo Calderon, Kawasaki; Shigehide Kuhara, Zama, all of Japan

[73] Assignee: Kabushiki Kaisha Toshiba, Kawasaki, Japan

[21] Appl. No.: 794,590

[22] Filed: Feb. 3, 1997

[30] Foreign Application Priority Data

Feb. 9, 1996 [JP] Japan .................................. 8-024093

[51] Int. Cl.$^6$ ...................................................... G01N 3/00
[52] U.S. Cl. ........................................ 324/318; 128/653.5
[58] Field of Search .................................... 324/318, 322, 324/300, 307, 309; 128/653.5

[56] References Cited

U.S. PATENT DOCUMENTS

| | | | |
|---|---|---|---|
| 5,574,373 | 11/1996 | Pausch et al. | 324/318 |
| 5,576,623 | 11/1996 | Muller | 324/318 |
| 5,585,724 | 12/1996 | Morich et al. | 324/318 |
| 5,627,470 | 5/1997 | Kuth | 324/318 |

*Primary Examiner*—Louis M. Arana
*Attorney, Agent, or Firm*—Oblon, Spivak, McClelland, Maier & Neustadt, P.C.

[57] ABSTRACT

An active shield type gradient coil apparatus comprises main coils for generating a gradient magnetic field and shield coils for generating a magnetic field to reduce the leak magnetic field from the main coils. In the active shield type gradient coil apparatus, a stimulation output section for outputting stimulation to a subject is incorporated. In this incorporation, the main coils are arranged at the outside of an area sandwiched between the stimulation output section and the subject such that the simulation can be transmitted to the subject from the stimulation output section without being blocked by the main coils. By this arrangement, both the use of the active shield type as the gradient coil apparatus and good transmission of stimulation to the subject can be realized.

27 Claims, 13 Drawing Sheets

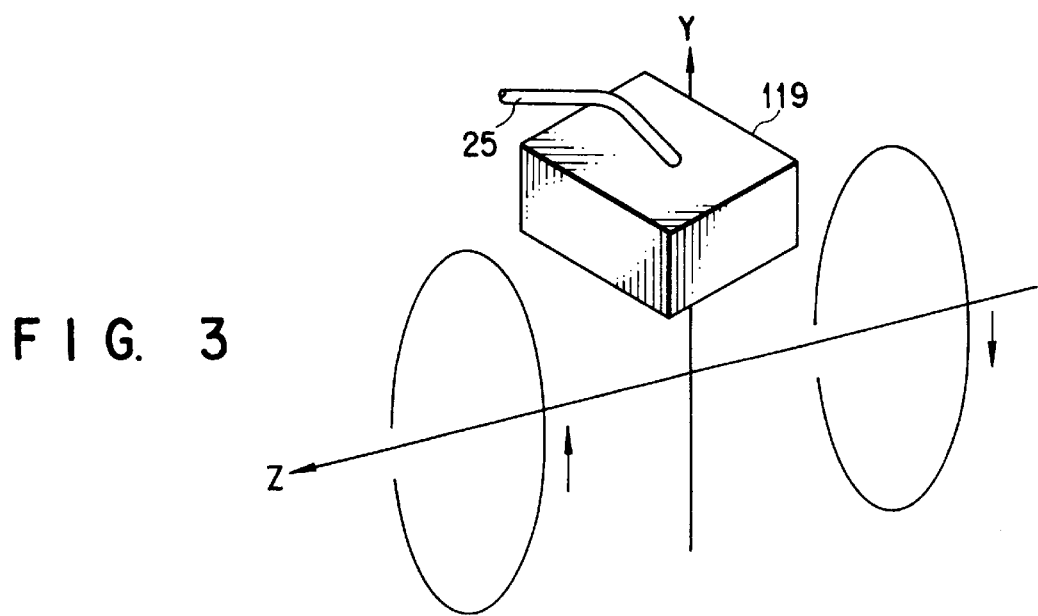
F I G. 3

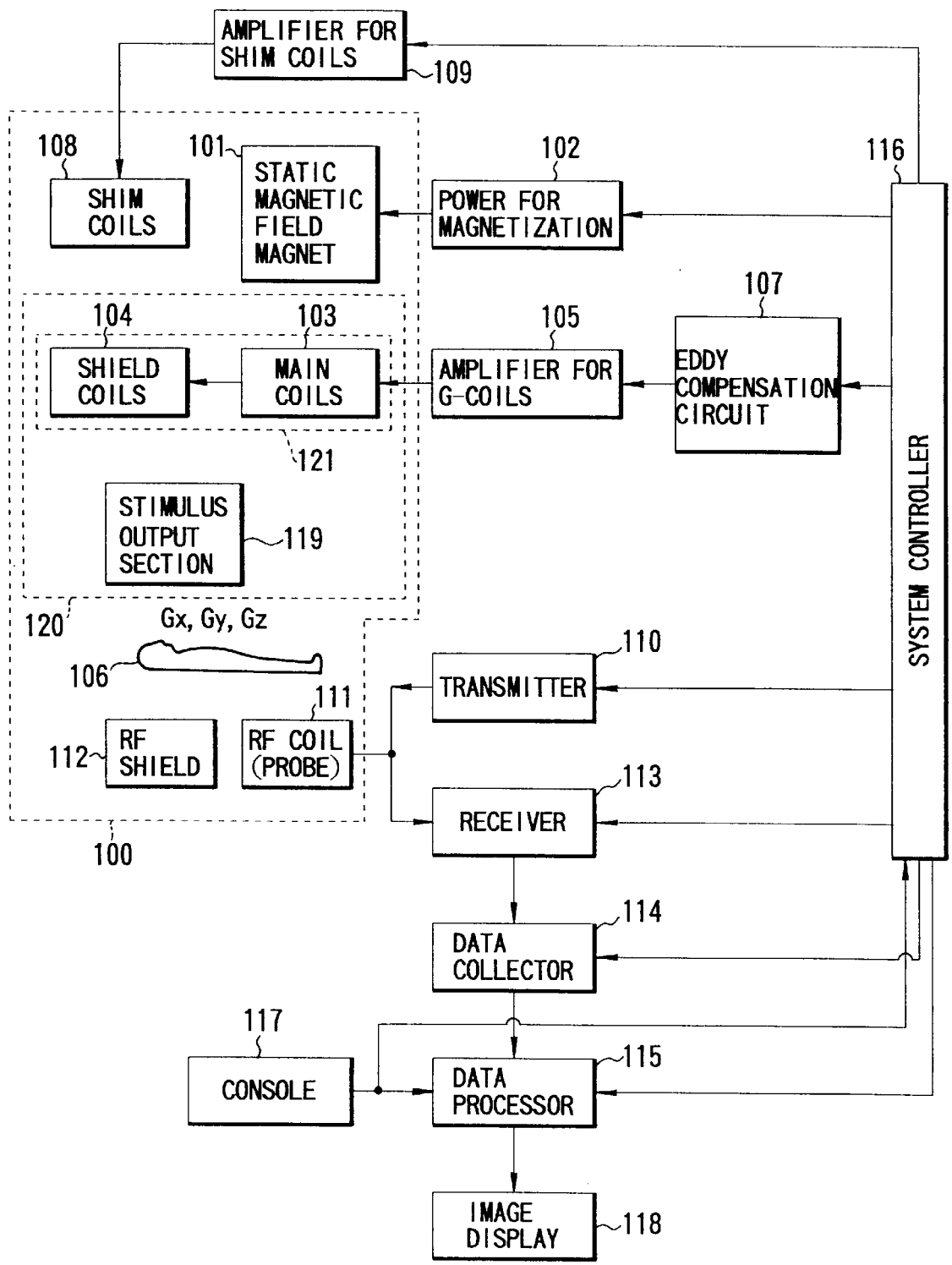
F I G. 2

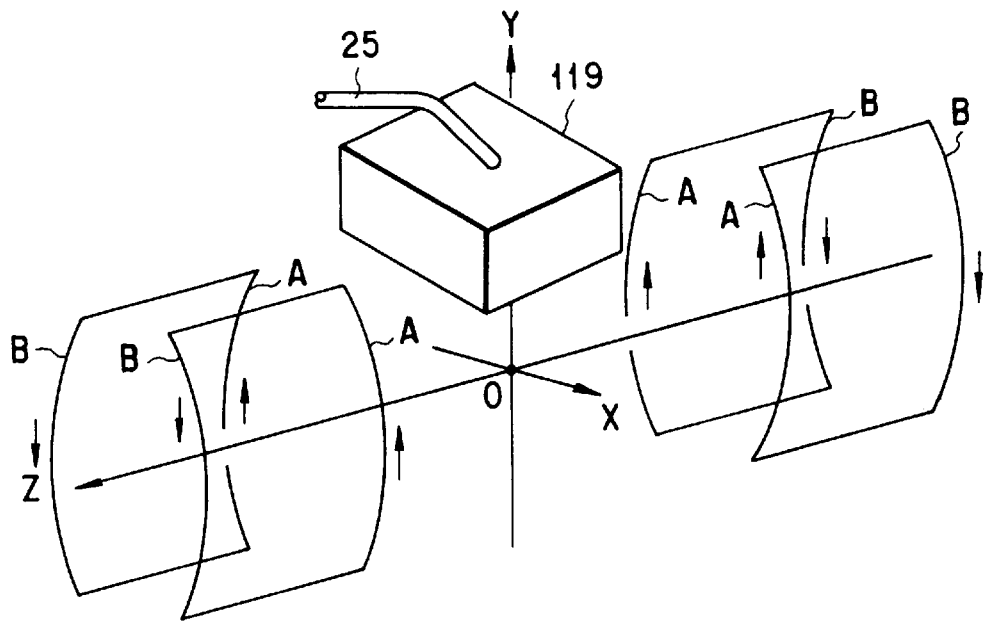
F I G. 4
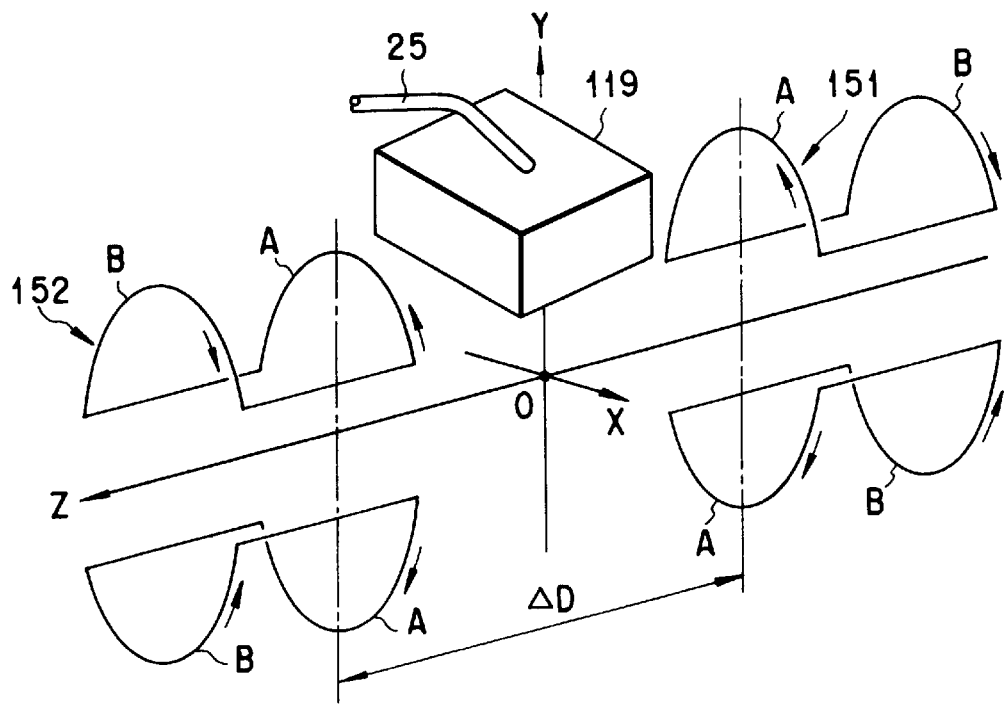
F I G. 5

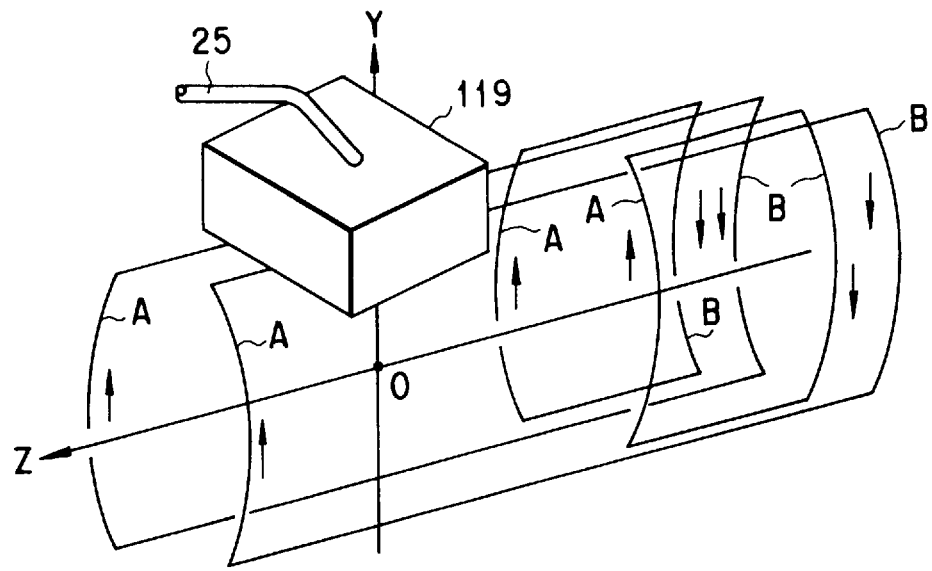
F I G. 6
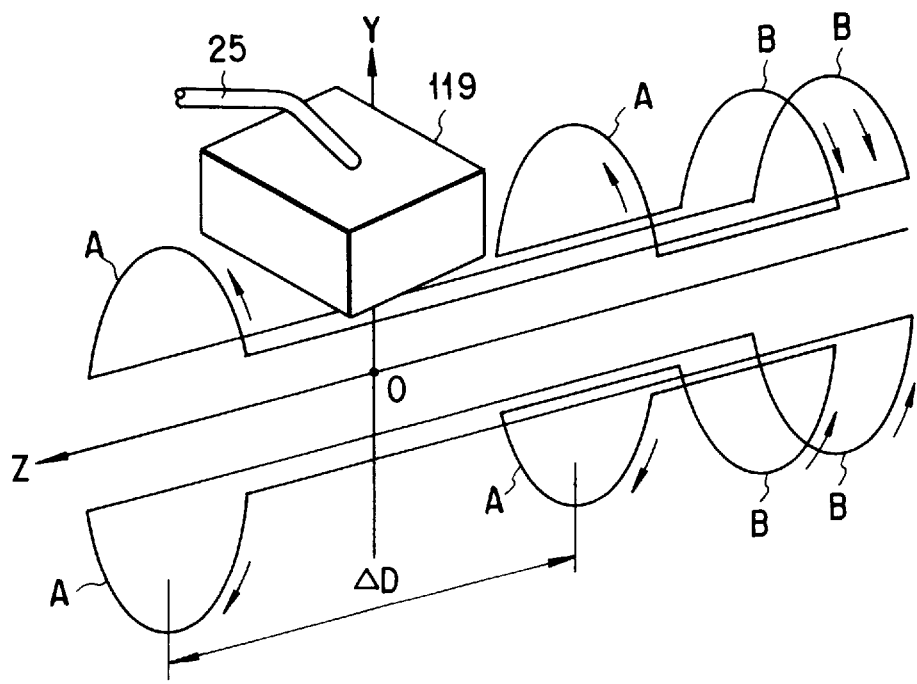
F I G. 7

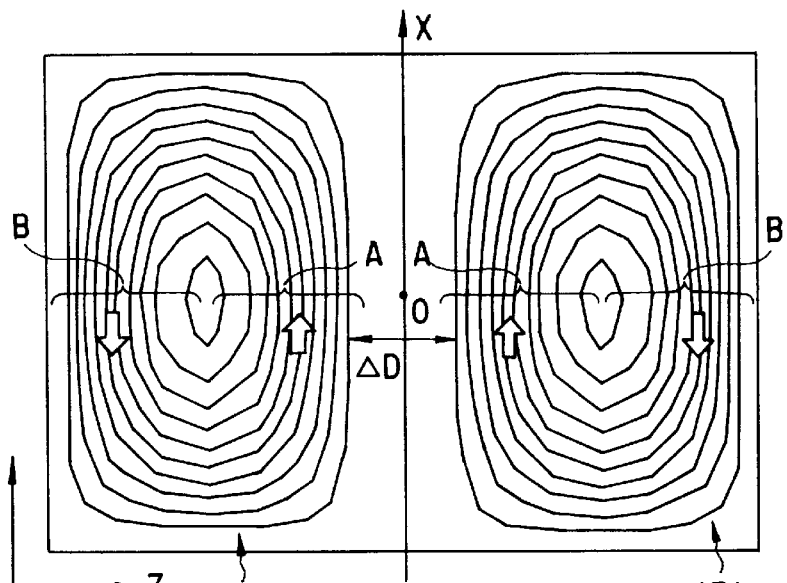
F I G. 8
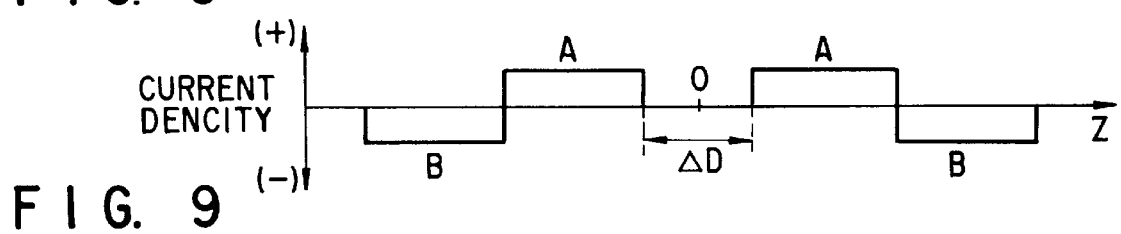
F I G. 9
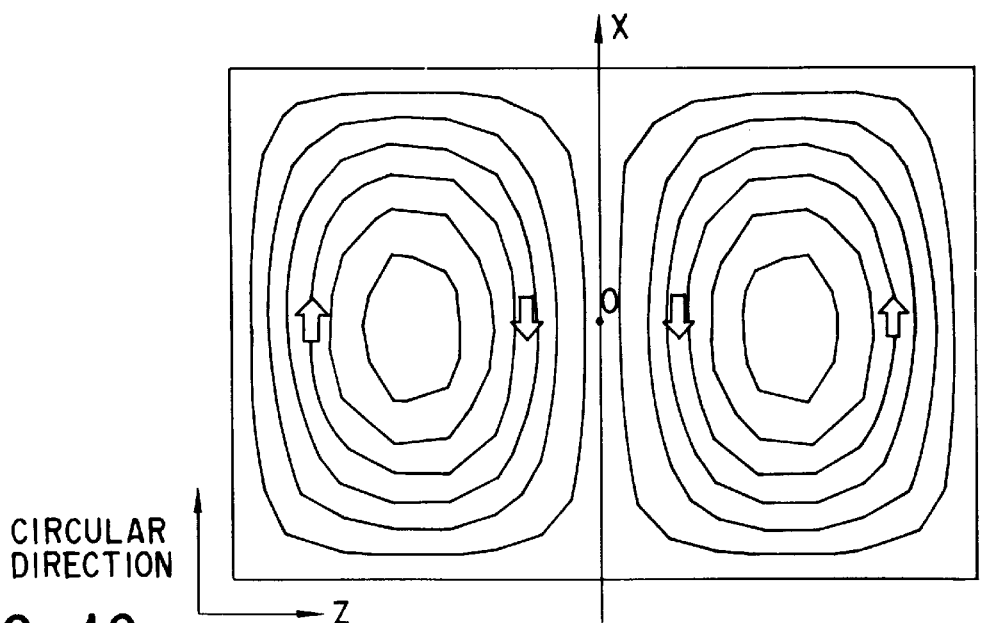
F I G. 10
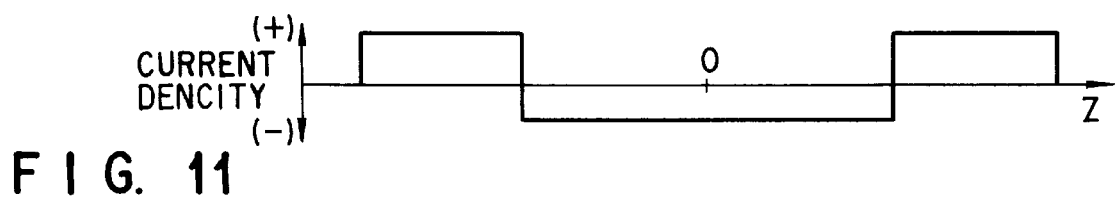
F I G. 11

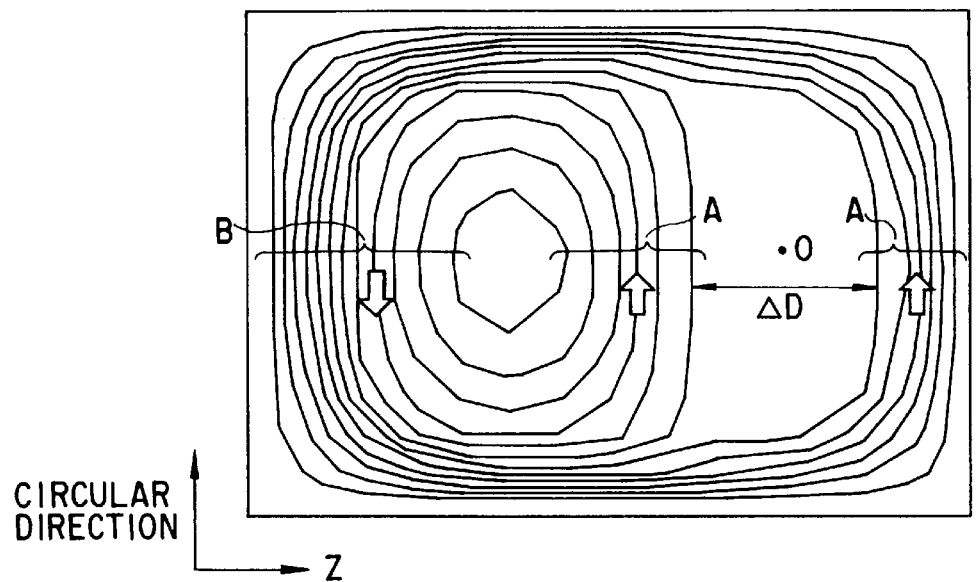
F I G. 12
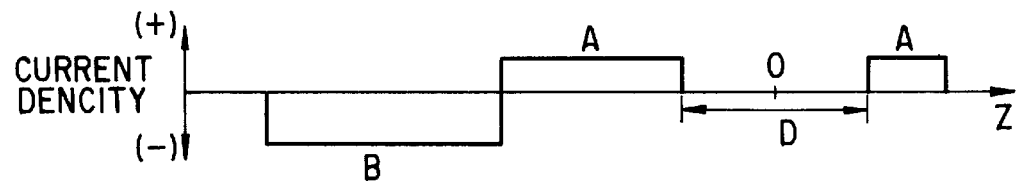
F I G. 13
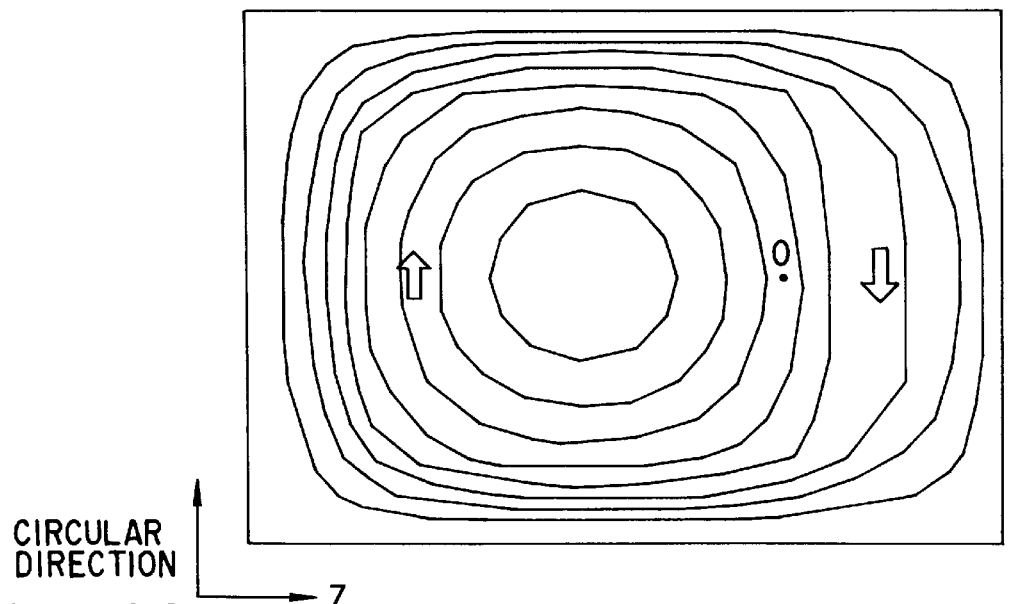
F I G. 14
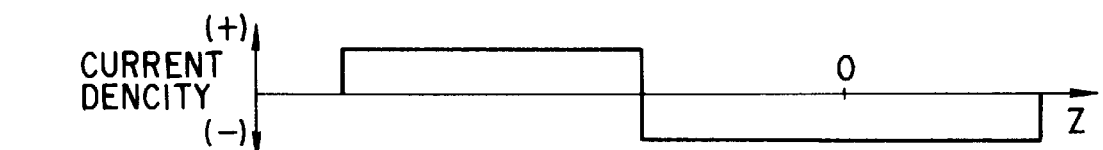
F I G. 15

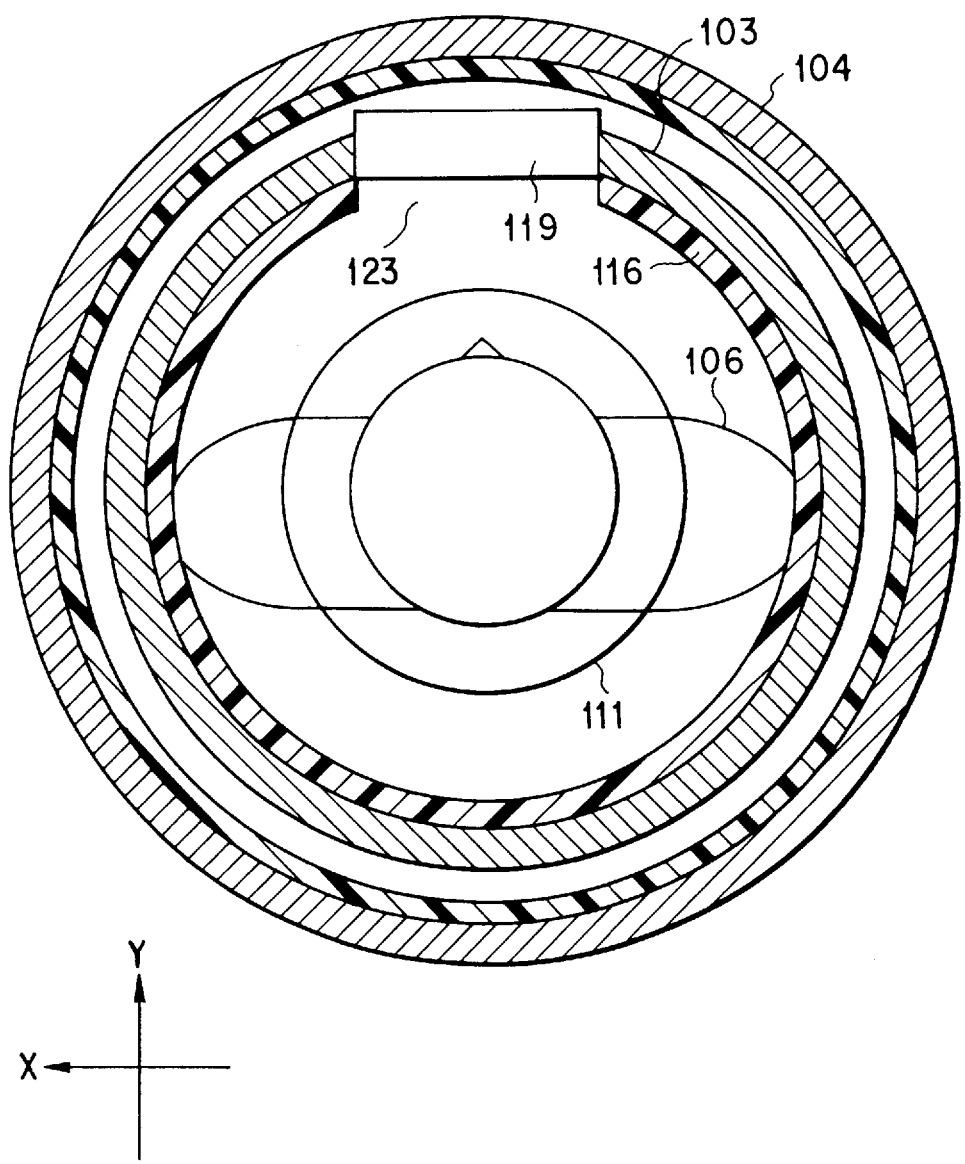
F I G. 17

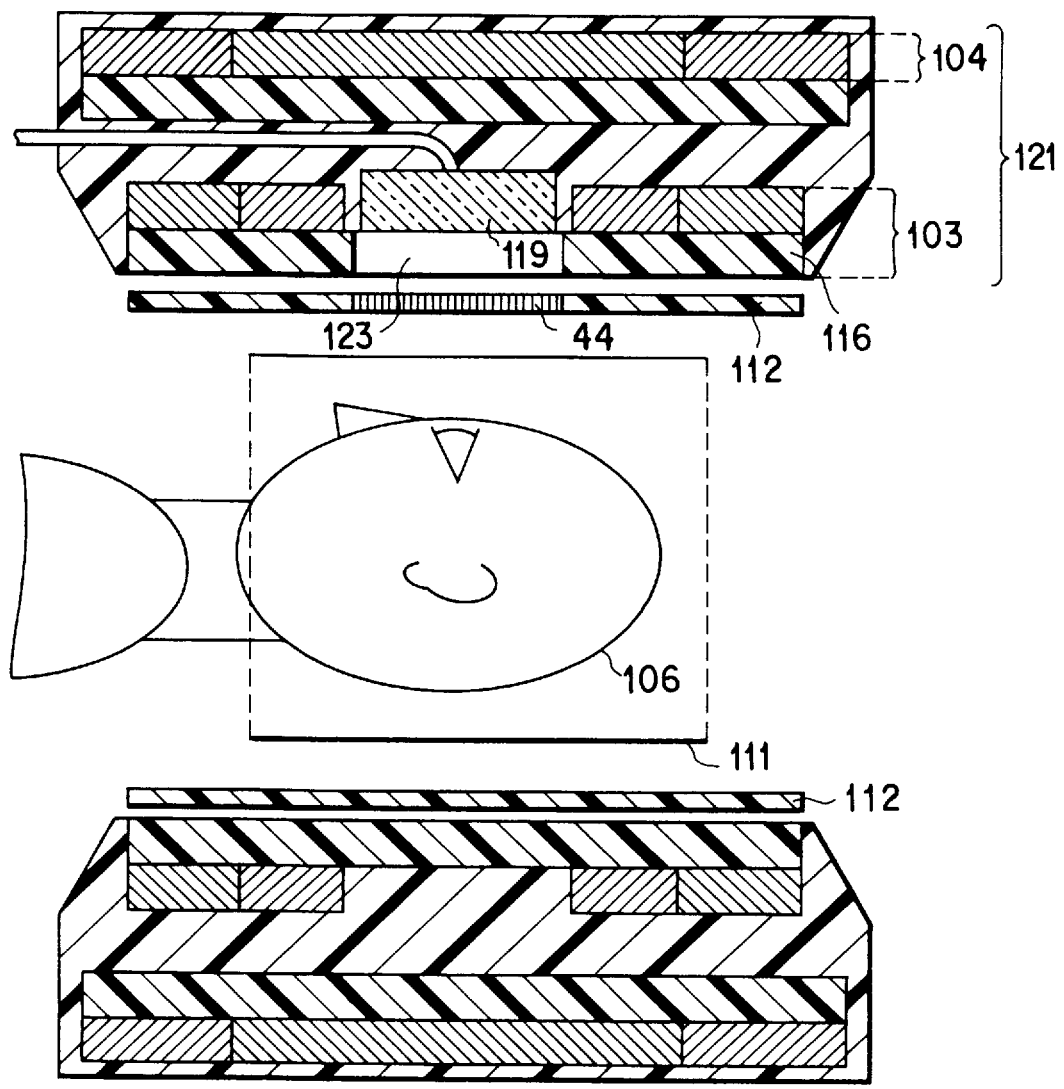
F I G. 18

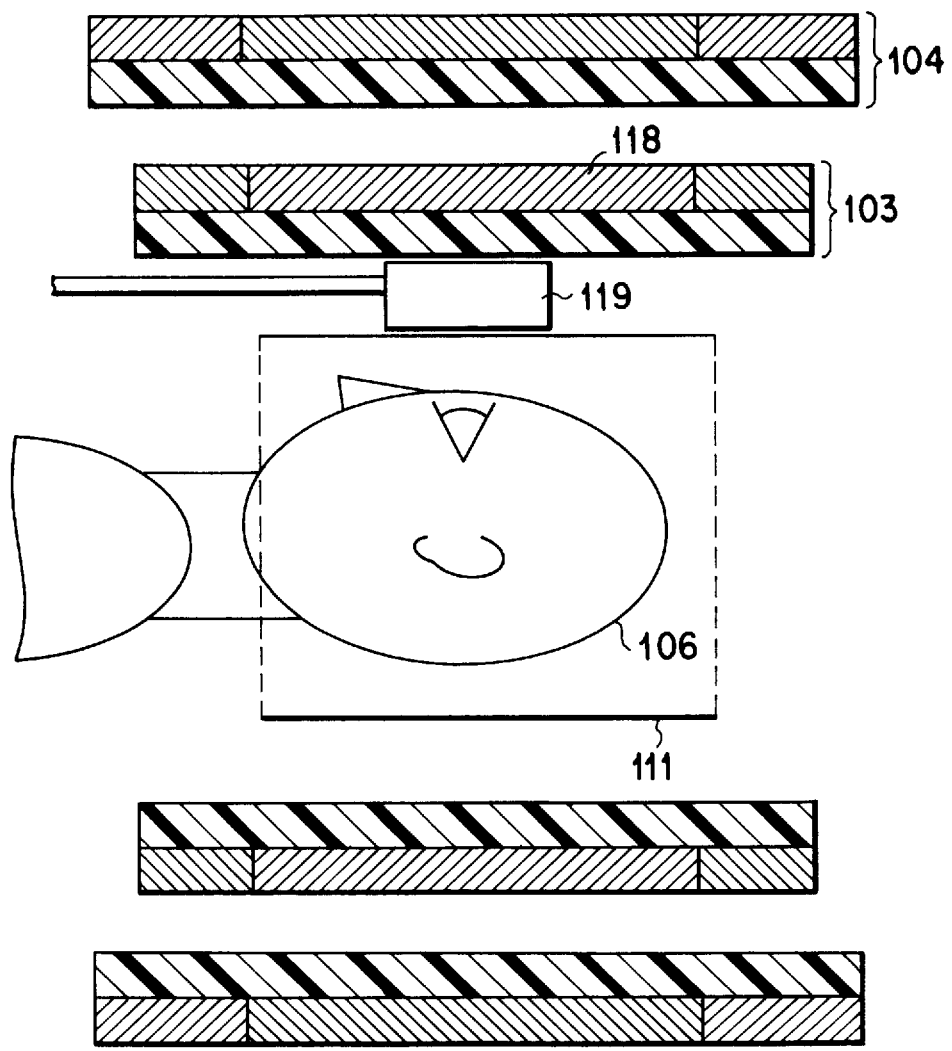
F I G. 19

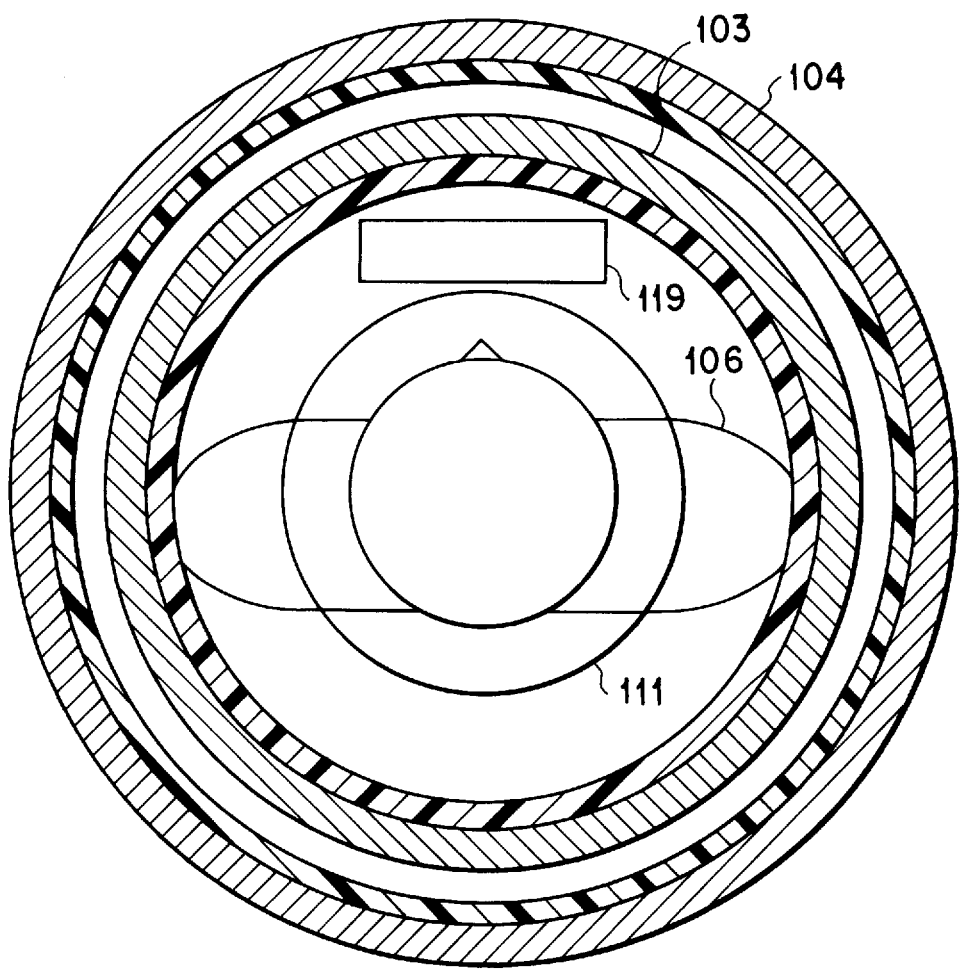
F I G. 20

GRADIENT COIL APPARATUS AND MAGNETIC RESONANCE IMAGING APPARATUS

BACKGROUND OF THE INVENTION

The present invention relates to a magnetic resonance imaging apparatus, more specifically, a gradient coil apparatus for producing a gradient magnetic field whose intensity of the magnetic field spatially changes.

A magnetic resonance imaging method is a method in which internal data of a subject can be obtained from an outer section. This magnetic resonance imaging method is known well. More specifically, a high frequency magnetic field, which rotates at a specific frequency, is applied to an atomic unclear, which is positioned in an even static magnetic field, that is, a magnetizing spin. As a result, the magnetizing spin absorbs energy. If the high frequency magnetic field is turned off, the magnetizing spin discharges the absorbed energy. Such absorbing and discharging phenomenon is a magnetic resonance phenomenon.

In such a magnetic resonance imaging method, the tissue structure of the interpolation of the subject can be imaged with high contrast. Moreover, the flow of the blood and the brain function can be imaged.

The brain imaging is a method in which a visual sense and an auditory sense are stimulated by flush light and sound so that the reaction of the brain to the stimulation can be obtained. For example, there is a BOLD (Blood Oxygenation Level Dependent) method. According to the BOLD method, only an active area, which reacts to the stimulation, can be extracted by differentiating images, one is obtained in giving stimulation to the brain, and the other is obtained in giving no stimulation to the brain.

Moreover, in the brain function imaging method, an EPI (Echo Planar Imaging) method is useful. According to the EPI method, data, which is necessary for reconstructing one image, can be collected for an extremely short period of time such as 20 msec. The short time collection of data is repeated. Thereby, it is possible to capture the state that the brain is gradually activated by stimulation, and gradually calmed down. Moreover, in EPI, since the number of signal errors, which is caused by the blood flow, is small, there is an advantage in which the reaction of the brain to the stimulation can be provided with high accuracy.

However, in EPI, it is needed that the gradient magnetic field having high intensity of 20[mT/m] or more be alternated at high speed for a short period of time such as 0.1[msec]. Such a high speed alternation causes occurrence of an eddy current in the magnetic member such as a radiant shield of superconductive magnet and a helium container. An eddy magnetic field, which is caused by the eddy current, is generated in a direction opposite to the gradient magnetic field. Due to this, since the waveform of the gradient magnetic field is distorted, a phase error occurs in an MR signal, and an artifact is generated on the image, which is finally reconstructed.

To solve the above problem, an active shield type gradient coil (ASGC) is needed in EPI. The active shield type gradient coil is used to cancel the magnetic field leaked from the main coil for generating the gradient magnetic field in the magnetic field generated from the shield coil. As a result, the eddy magnetic field is prevented from being generated.

As mentioned above, since the gradient magnetic field having high intensity of 20 [mT/m] must be alternated for the short period of time such as 0.1 [mT/m], the load of the power supply is extremely large. To make the inductance of the coil smaller to reduce the load, an apparatus having a gradient coil whose size is reduced has been developed to be dedicated to the local portion such as a head.

In the conventional brain function imaging, the subject was simply stimulated by flush light. However, in the near future, it can be considered that an optical image is mainly shown to the subject to observe the complicated reaction. Conventionally, as shown in FIG. 1, an optical image from a display generator (not shown) of an outer portion was reflected by a mirror 81 to be transmitted to a subject 106 through a window 95 formed on a gradient coil apparatus 91.

However, in ASGC, the above-mentioned image transmitting method cannot be used. Specifically, the window must be formed on not only the main coil but also a shield coil to use the conventional image transmitting method in ASGC. Due to this, the magnetic field is leaked from the window of the shield coil, and an original shield effect of the magnetic field of ASGC is considerably reduced. This problem may be solved by arranging an optical path and a mirror between the main coil and the shield coil. However, if such an arrangement is provided, the gradient coil apparatus is enlarged.

As mentioned above, in the conventional case, it was impossible to stimulate the brain of the subject by the optical image as using ASGC in the gradient coil apparatus.

BRIEF SUMMARY OF THE INVENTION

An object of the present invention is to provide a gradient coil apparatus, which is capable of transmitting stimulation to a subject as using an active shield type gradient coil (ASGC).

According to the first aspect of the present invention, there is provided a gradient coil apparatus comprising:

main coils for locally generating a gradient magnetic field;

shield coils for generating a magnetic field to reduce the magnetic field leaked from the main coils; and a stimulation output section for outputting stimulation to a subject, wherein the main coils are arranged at the outside of an area between the stimulation output section and the subject such that the stimulation can be transmitted to the subject.

According to the second aspect of the present invention, there is provided a gradient coil apparatus comprising:

main coils for generating a gradient magnetic field;

shield coils for generating a magnetic field to reduce the magnetic field leaked from the main coils; and a stimulation output section for outputting stimulation to a subject, wherein the main coils include two coils arranged to have a predetermined distance along a direction of a static magnetic field, and the stimulation output section is provided between these two coils.

According to the third aspect of the present invention, there is provided a gradient coil apparatus comprising:

main coils for generating a gradient magnetic field;

shield coils for generating a magnetic field to reduce the magnetic field leaked from the main coils; and a stimulation output section for outputting stimulation to a subject, wherein the main coils are arranged such that an effective current component for forming a magnetic field gradient in a imaging area to be distributed to two portions to have a predetermined distance along a direction of a static magnetic field, and the stimulation output section is provided in the interval between the effective current components.

According to the fourth aspect of the present invention, there is provided an magnetic resonance imaging apparatus, having a static magnetic field magnet, a gradient coil apparatus, and an RF coil, for imaging an internal portion of a subject by use of a magnetic resonance phenomenon, the gradient coil apparatus comprising main coils for locally generating a gradient magnetic field; shield coils for generating a magnetic field to reduce the magnetic field leaked from the main coils; and a stimulation output section for outputting stimulation to a subject, wherein the main coils are arranged at the outside of an area between the stimulation output section and the subject such that the stimulation can be transmitted to the subject.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing a magnetic resonance imaging apparatus according to a first embodiment of the present invention;

FIG. 3 is a view showing a first example of a Z coil as a main coil of ASGC of FIG. 1;

FIG. 4 is a view showing a first example of an X coil as a main coil of ASGC of FIG. 1;

FIG. 5 is a view showing a first example of a Y coil as a main coil of ASGC of FIG. 1;

FIG. 6 is a view showing a second example of the X coil as a main coil of ASGC of FIG. 1;

FIG. 7 is a view showing a second example of the Y coil as a main coil of ASGC of FIG. 1;

FIG. 8 is a view showing a third example of the Y coil as a main coil of ASGC of FIG. 1;

FIG. 9 is a view showing a current density distribution of the Y coil of FIG. 8;

FIG. 10 is a view showing a Y coil of a shield coil corresponding to the Y coil as a main coil of FIG. 8;

FIG. 11 is a view showing a current density distribution of the Y coil of FIG. 10;

FIG. 12 is a view showing a fourth example of the Y coil as a main coil of ASGC of FIG. 1;

FIG. 13 is a view showing a current density distribution of the Y coil of FIG. 12;

FIG. 14 is a view showing a Y coil of a shield coil corresponding to the Y coil as a main coil of FIG. 12;

FIG. 15 is a view showing a current density distribution of the Y coil of FIG. 12;

FIG. 17 is a horizontal cross-sectional view showing the gradient coil apparatus of this embodiment;

FIG. 18 is a view showing an RF shield of FIG. 2;

FIG. 19 is a view showing a comparative example for the gradient coil apparatus of this embodiment;

FIG. 20 is a vertical cross-sectional view of the gradient coil apparatus of FIG. 18;

DETAILED DESCRIPTION OF THE INVENTION

Figure 1:
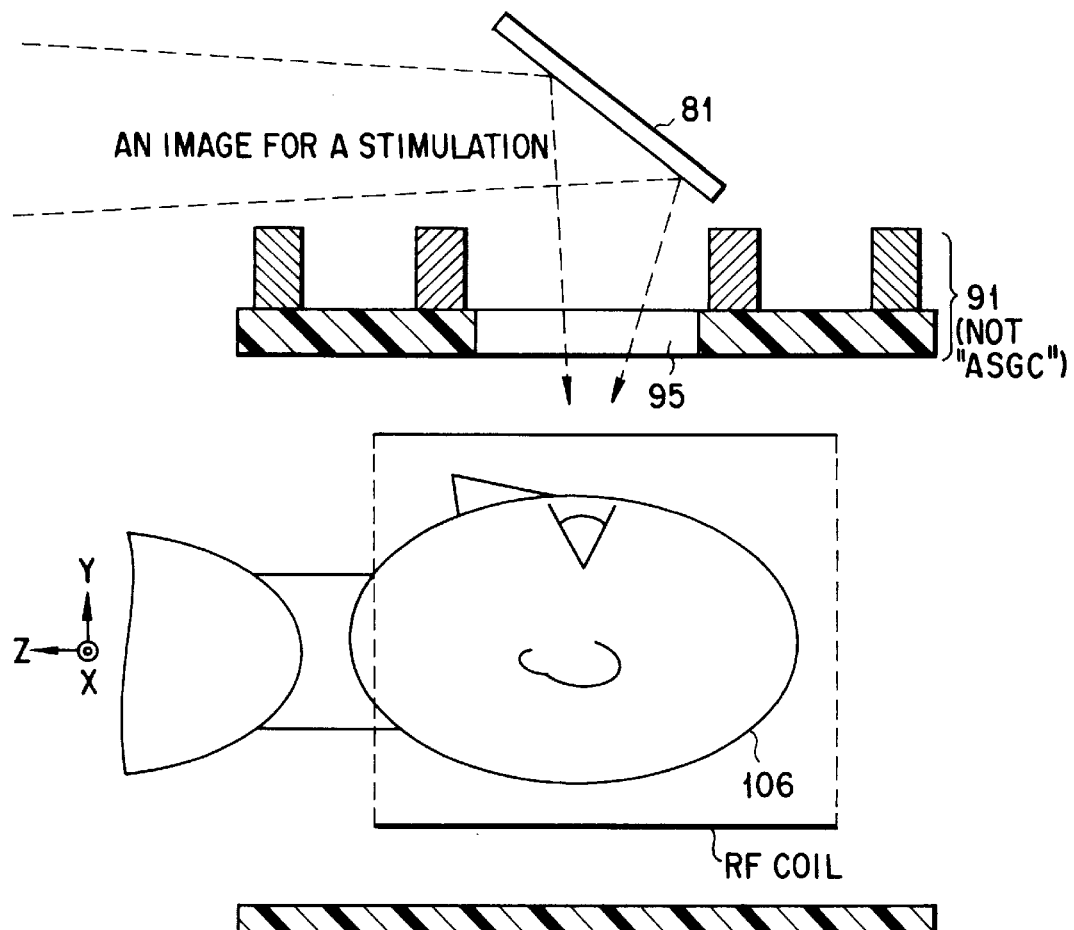
FIG. 1 is a vertical cross-sectional view showing a conventional gradient coil apparatus for reflecting an optical image by a mirror to be transmitted to a subject.

Embodiments of the present invention will be explained with reference to the drawings. The following will explain an MRI (Magnetic Resonance Imaging) apparatus for an exclusive use of a local part as an example. In order to make the inductance of the coil smaller to reduce the load of the power supply and to improve the rise of the gradient magnetic field and the high speed switching performance, the MRI apparatus for an exclusive use of a local part is developed. More specifically, the size of the MRI apparatus is formed to be smaller than that of an MRI apparatus for the use of a whole body so as to image mainly the local parts of the body such as a head portion, arms and legs.

In this example, the following optical image is assumed.

Specifically, there is shown an optical image, which can carry out not only an examination for a complicated reaction to various kinds of stimuli such as flash light, sound, smell, etc., to stimulate the brain, but also transmission of various kinds of messages to a subject. Thereby, communication between an expert operator and the subject can be improved.

(FIRST EMBODIMENT)

FIG. 2 is a block diagram showing an MRI apparatus for an exclusive use of a local part according to a first embodiment of the present invention. A coil assemble 100 comprises a static magnetic field magnet 101, shim coils 108, a gradient coil apparatus 120 for an exclusive use of a local part, an RF (Radio Frequency) shield 112, and an RF coil (probe) 111, which are assembled from the outside in order to surround a cylindrical imaging area.

The static magnetic field magnet 101 is a normal or super-conductive coil. A power supply 102 for magnetization continuously or temporarily supplies a current to the static magnetic field magnet 101 in accordance with the instruction of a system controller 116. As a result, a magnetic field is generated in the imaging area from the static magnetic field magnet 101. Just for convenience, a real space is defined by three axes (X-, Y-, and Z-axes), which are perpendicular to one another at the center of a imaging area. The Z-axis is parallel to the direction of the static magnetic field.

The shim coils 108 comprise a plurality of coils. These coils are dispersely arranged at the inside of the static magnetic field magnet 101. An amplifier for shim coils 109 supplies a current to the shim coils 108 in accordance with the instruction of the system controller 116. As a result, a magnetic field, which is necessary for improving evenness of the magnetic field, is generated.

An amplifier 105 for gradient coils amplifies a wave signal, which is output from the system controller 116 and compensated by an eddy compensation circuit 107. Then, the amplified signal (current pulse) is supplied to a gradient coil apparatus 120. The gradient coil apparatus 120 produces a gradient magnetic field in the imaging area when receiving the current from the amplifier 105.

A transmitter 110 supplies a high frequency signal such as a sinc wave, etc. to the RF coil 111 in accordance with the control of the system controller 116. As a result, a magnetizing spin is excited, or a high frequency magnetic field for reserving the phase of the magnetizing spin is generated from the RF coil 111. The RF coil 111 is shielded from the outer section by the RF (high frequency) shield 112.

A receiver 113 amplifies a weak MR signal received by the RF coil 111 to be detected and converted to a digital signal. A data collector 114 collects data output from the receiver 113 during one pulse sequence. A data processor 115 reconstructs an MR image from data collected by the data collector 114 by, for example, a two-dimensional Fourier inverse transform. An image display 118 is provided to display the reconstructed MR image. A console 117 is provided to input various operator's commands.

The following will specifically explain the gradient coil apparatus 120 for an exclusive use of a local part.

In this case, an active shield type is used as the gradient coil apparatus 120. An active shield type gradient coil (ASGC) 121 comprises a main coil 103 for generating a gradient magnetic field, and a shield coil 104 for generating a magnetic field to reduce a leak magnetic field to the outer portion from the main coil 103.

Each of the main coil 103 and the shield coil 104 has X and Y coils, which are shown in FIGS. 4 and 6, and a Z coil shown in FIG. 3. As types of X and Y coils, for example, there are a concentrated winding type and a spiral type (distribution type). The winding type is formed of a bundle of coil wire materials as shown in FIGS. 3 to 7, and the spiral type (distribution type) is formed by spirally distributing coil wire materials as shown in FIGS. 8, 10, 12, and 14.

As a coil arrangement, there are a symmetrical type and an asymmetrical type. In the symmetrical type, coil segments are symmetrically arranged in relative to the center O of the imaging as shown in FIGS. 3 to 5, 8, and 10. In the asymmetrical type, the coil segments are asymmetrically arranged relative to the center O of the imaging as shown in FIGS. 6, 7, 12, and 14.

In FIGS. 3 to 7, 8, 10, and 14, each of arrows shows the direction of the current. In the current flowing in the main coil 103, current components, which flow in a circumferential direction around the Z-axis, create the gradient of the intensity of the magnetic field relative to each of the X-, Y-, and Z-axes. Among the current components, the current component flowing in a forward direction is defined as an "effective current component" which creates the gradient of the magnetic field in the imaging area. On the other hand, the current component flowing in an opposite direction is defined as an "ineffective current component" which does not create the gradient of the magnetic field in the imaging area. Such current components are expressed by a vertical axis showing the density of the current and a horizontal axis showing a position of the Z-axis as shown in FIGS. 9, 11, 13, and 15. Thereby, a "current density distribution" can be formed. The current density distribution is determined by the spatial arrangement of the coil wire materials of the main coil 103. As is known, the design of the coil arrangement is carried out such that the necessary current density distribution is first determined to realize the current density distribution.

Figure 16:
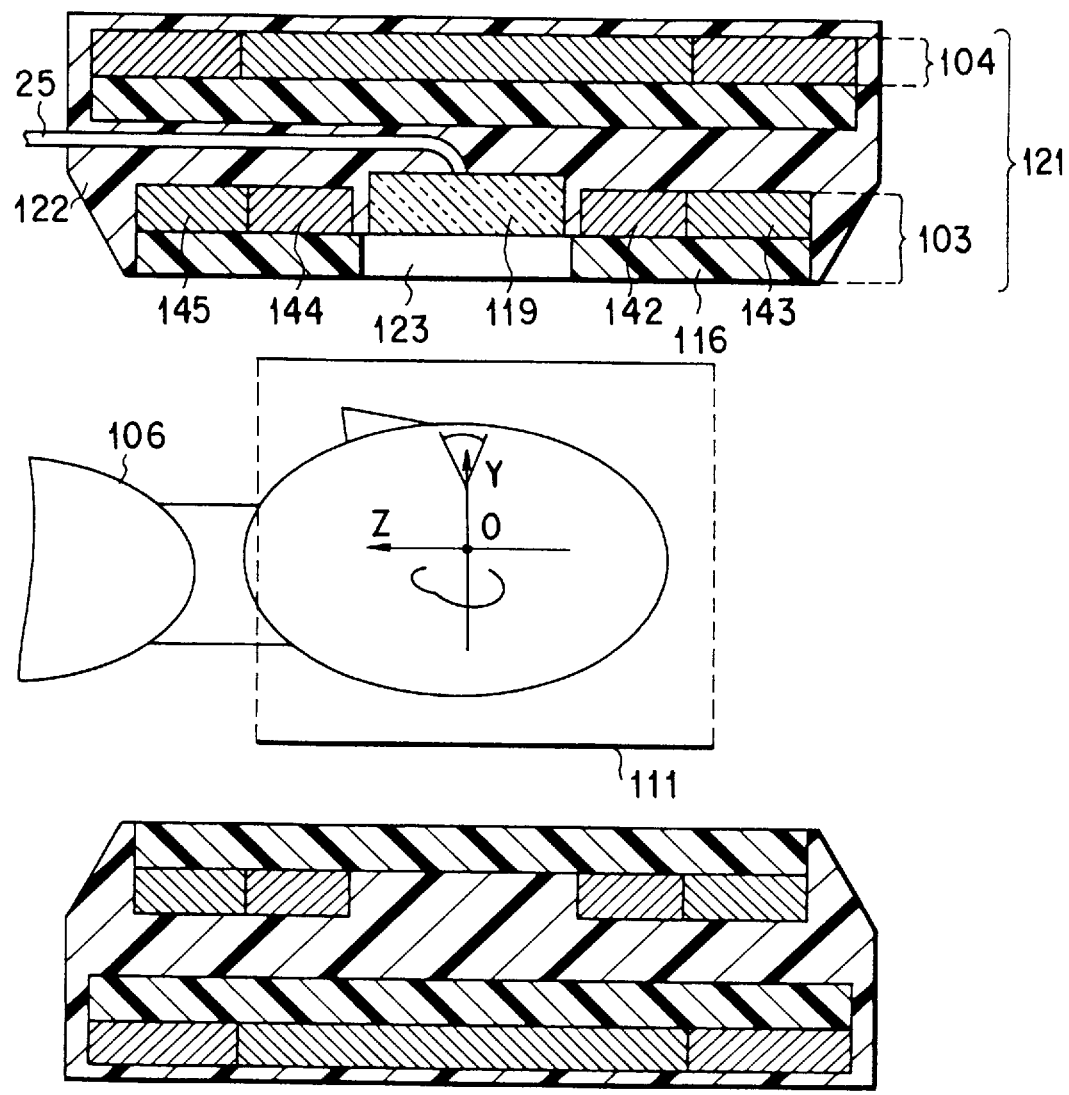
FIG. 16 is a vertical cross-sectional view showing the gradient coil apparatus of this embodiment.

In addition to ASGC 121, a stimulation output section 119 is provided in the gradient coil apparatus 120. FIG. 16 is a vertical cross-sectional view of the gradient coil apparatus 120 corresponding to the coil type of FIG. 8, and FIG. 17 is its horizontal cross-sectional view. The stimulation output section 119 comprises an optical system. The optical system includes an optical lens such that an optical image generated by an outer generator (not shown) is received through an optical fiber bundle 25. Also, the optical system includes the optical lens such that the optical image is enlarged to an appropriate size to be visually provided to a subject 106. It is possible to replace the stimulation output section 119 with a diode array, a liquid crystal display, or a CRT.

A housing 122 of the gradient coil apparatus 120 is a plastic molding. In the housing 122, the stimulation output section 119, and the optical fiber bundle 25 are incorporated in advance together with the ASGC 121. The stimulation output section 119 and ASGC 121 are incorporated in the housing 122 as follows.

Specifically, the arrangement of the Y coils of the main coil 103 is contrived in order to create a space for setting the stimulation output section 119.

If the Y coils of the main coil 103 are the spiral coils, the Y coils are arranged as follows:

Specifically, as shown in FIGS. 9, 13, in the current density distribution, the Y coils are arranged such that the effective current component A is distributed to be separated into two portions along the Z-axis regardless of the symmetrical and asymmetrical types. In this case, each of the separated effective current components A is set to have an interval with a predetermined distance $\Delta D$, which is larger than the width of the stimulation output section 119. In the interval of the effective current component A, the current density is continuously zero. In the conventional case, the effective current component A was continuously provided without being separated.

As shown in FIG. 8, if the types of the Y coils of the main coil 103 are symmetrical, the Y coils 131 and 132 are arrayed along the Z-axis to have an interval with a predetermined distance $\Delta D$. Moreover, as shown in FIG. 12, if the types of the Y coils of the main coil 103 are asymmetrical, the coil wire materials are closely distributed in the distribution range of two effective current components A. In this case, the coil wire materials are not distributed in the interval between the effective current components A.

In FIG. 16, reference numerals 142 and 144 show ranges where the coil segments for supplying the effective current component A are distributed. Moreover, reference numerals 143 and 145 show ranges where the coil segments for supplying the noneffective current component B are distributed.

Even if the effective current component A is separated into two portions, linearity of the gradient magnetic field in the imaging area must be ensured. Therefore, a width of the stimulation output section 119 is limited less than the interval which can be allowed to ensure the linearity at its maximum.

In this way, the stimulation output section 119 is incorporated in the interval which can be allowed to ensure the linearity at its maximum. In other words, the Y coils of the main coil 103 are arranged in an area other than the area, which is sandwiched between the stimulation output section 119 and the subject 106.

A part of a coil bobbin 116 is superimposed on the area sandwiched between the stimulation output section 119 and the subject 106. The part is cut to be used as a window 123. The subject 106 can see the optical image, which is output from the stimulation output section 119, through the window 123.

As mentioned above, the effective current component is separated into two portions with the interval. The stimulation output section 119 is incorporated into the interval between these separated effective current components. As a result, the optical image can be transmitted to the subject 106 as using ASGC 121. This effect can be realized without enlarging the size of the apparatus.

Moreover, the Y coils of the main coil 103 can be arranged at the inside of the Y coils of the shield coil 104 together with the stimulation output section 119. In other words, the Y coils of the shield coil 104 can be substantially equally distributed in the direction of the Z-axis as shown in FIGS. 10 and 14. These Y coils are distributed such that the interval whose current density becomes zero is not formed in the current density distribution as shown in FIGS. 11 and 15. As a result, the magnetic field can be prevented from being leaked.

If the Y coils of the main coil 103 are the concentrated winding coils, the Y coils are arranged as follows:

Specifically, as shown in FIGS. 5 and 7, the Y coils are arranged such that two coil bundles where the effective current component A flows are provided along the Z-axis regardless of the symmetrical and asymmetrical types. In this case, each of the coil bundles is set to have an interval with a predetermined distance ΔD, which is larger than the width of the stimulation output section 119. In other words, as shown in FIG. 5, if the types of the Y coils of the main coil 103 are symmetrical, the Y coils 151 and 152 are arrayed along the X-axis to have an interval with a predetermined distance ΔD. Moreover, as shown in FIG. 7, if the types of the Y coils of the main coil 103 are asymmetrical, the coil bundles where the effective current component A flows are arranged along the Z-axis. These coil bundles are arranged to be set to have an interval with a predetermined distance ΔD, which is larger than the width of the stimulation output section 119. Thus, the stimulation output section 119 is incorporated into the interval between two coil bundles where the effective current component A flows. In other words, the Y coils of the main coil 103 are arranged in an area other than the area, which is sandwiched between the stimulation output section 119 and the subject 106. A part of the coil bobbin 116 is superimposed on the area sandwiched between the stimulation output section 119 and the subject 106. The part is cut to be used as the window 123. The subject 106 can see the optical image, which is output from the stimulation output section 119, through the window 123. Thus, even in the case of using the concentrated winding type, the optical image can be transmitted to the subject 106 as using ASGC 121, similar to the spiral type. This effect can be realized without enlarging the size of the apparatus. Moreover, the leakage of the magnetic field can be prevented.

The RF shield 112 is formed between the main coil 103 of ASGC 121 and the RF coil 111 to increase a quality factor of the RF coil 111. Normally, the RF shield 112 is adhered to the inner wall of the coil bobbin 116 of the main coil 103.

As shown in FIG. 18, at least a part of the RF shield 112 (a portion which is superimposed on the area between the eyes of the subject 106 and the stimulation output section 119) is formed of a mesh conductor 44 such that the RF shield 112 is not optically passed between the subject 106 and the stimulation output section 119. Moreover, a slit may be formed in this part. Or, this part may be a transparent conductor such as a transparent electrode of a touch panel.

According to the above embodiment, the stimulation output section 119 is incorporated into ASGC 121, so that the optical image can be transmitted to the subject 106 as using ASGC 121. This effect can be realized without enlarging the size of the apparatus. Moreover, the leakage of the magnetic field can be prevented.

As mentioned above, the stimulation output section 119 is incorporated into the main coil 103. Even if the inner diameter of the gradient coil apparatus 120 is made smaller, the following problem can be relaxed. Specifically, the problem is that the subject 106 cannot clearly see the optical image after the distance between the stimulation output section 119 and the eyes of the subject 106 is made longer. As a result, since it is possible to easily overlook, the operator can show the image to the subject. Or, the operator can show a plurality of light-emitting materials to the subject at the same time. Moreover, there is possibility that a different examination result will be brought about between a brain examination, which is carried out under a condition that the wide field of view can be easily overlooked, and a brain examination, which is carried out under a condition that a focus adjusting must be forcibly performed. The former condition is, of course, favorable. Also, by use of the stimulation output section 119, not only the optical image for stimulation is displayed but also the operator can show an image for relaxing the subject to the subject.

As shown in FIGS. 19 and 20, similar to the conventional case, the stimulation output section 119 may be attached to the inside of the main coil 103, that is, the inner wall of the coil bobbin 116. In this case, the wire materials of the spiral coils are arranged such that the effective current components A are continuously distributed. However, there is the problem in which the subject 106 cannot clearly the optical image since the distance between the stimulation output section 119 and the subject 106 is short. To solve the problem, the stimulation output section 119 may be made thin, may be made a shape so that the section 119 can be stacked on a inner face of the coil bobbin 116, or the inner diameter of the gradient coil apparatus 120 may be enlarged.

In the case of the X coils, since the X coils does not interfere with the stimulation output section 119, it is unnecessary to form the above-mentioned interval. However, the present invention can be applied to the X coils. As a case of applying the present invention to the X coils, for example, in the use of voice stimulation, that voice stimulation output sections (ex. speakers) are arranged on both sides of the subject. These speakers have structures that aren't influenced by gradient coils can be considered. As is known, the X coils correspond to the case in which the Y coils are rotated at 90° around the Z-axis. Therefore, similar to the Y coils, the present invention can be applied to the X coils.

(SECOND EMBODIMENT)

The farsighted or shortsighted subject 106 cannot see the optical image well without wearing the glasses. However, the subject 106 with glasses cannot be allowed to enter the imaging area. An object of this embodiment is that the farsighted or shortsighted subject 106 can see the optical image well without wearing the glasses.

Figure 21:
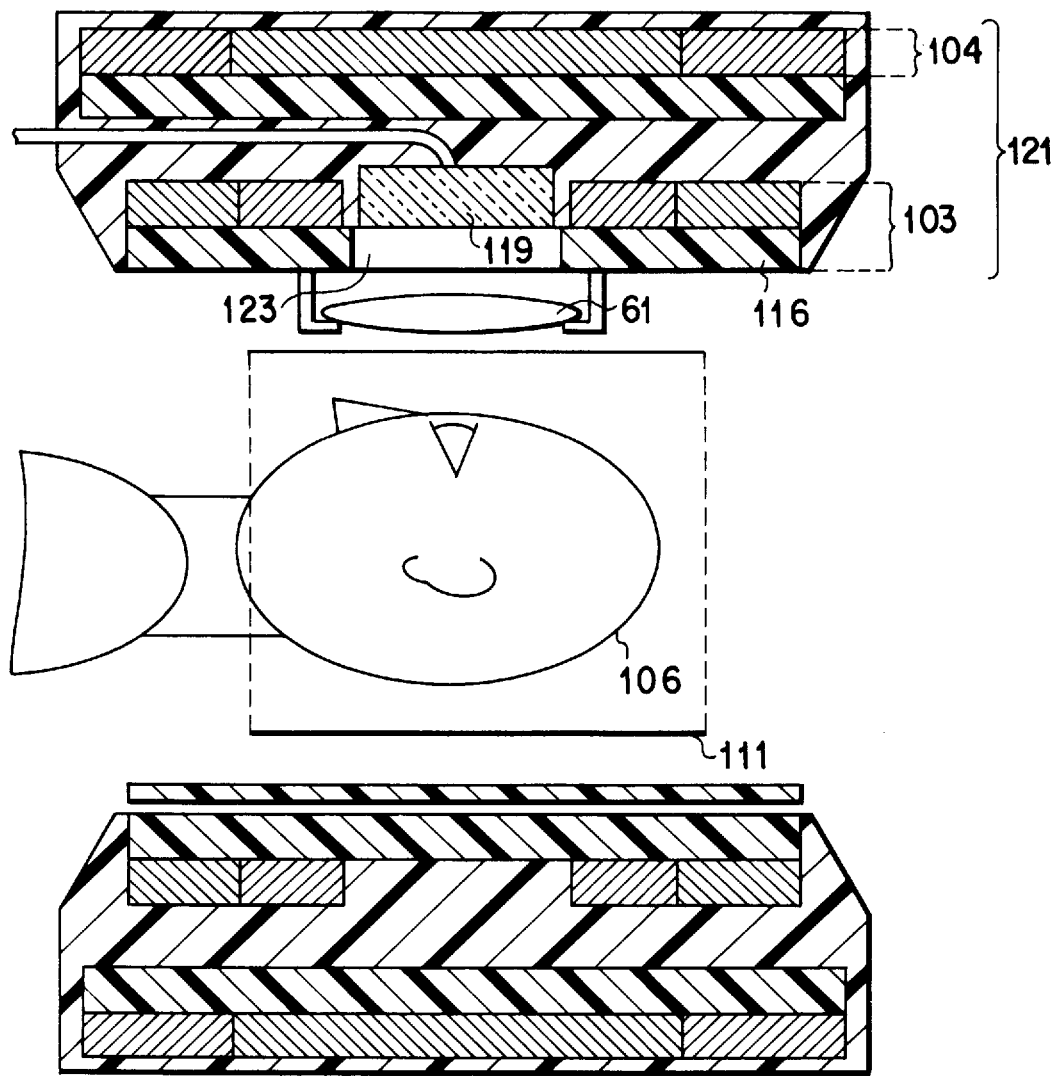
FIG. 21 is a vertical cross-sectional view of a gradient coil apparatus for an exclusive use of a local part according to a second embodiment of the present invention.
Figure 22:
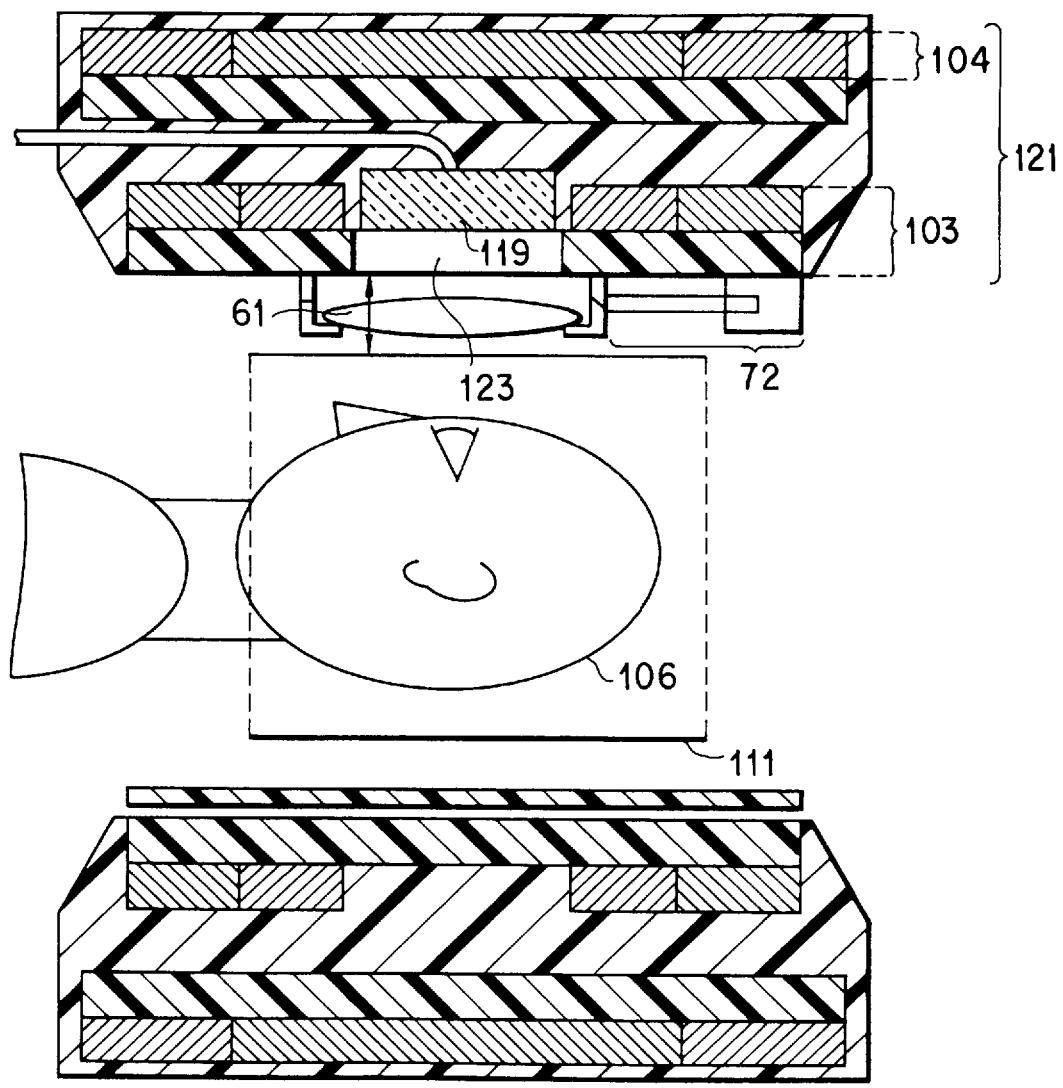
FIG. 22 is a view showing an application of the gradient coil apparatus of FIG. 21.

FIG. 21 is a vertical cross-sectional view of the gradient coil apparatus of the second embodiment of the present invention. The same reference numerals as FIG. 16 are added to the portions common to FIG. 16, and the explanation is omitted. In this embodiment, an optical lens 61, serving as optical path changing means, is provided at a portion between the subject 106 and the stimulation output section 119 and the inside of the window 123. As the optical path changing means, a Frenel lens, a mirror, etc. may be used in place of the optical lens 61. Moreover, as shown in FIG. 22, the distance between the optical lens 61 and the eyes of the subject 106 is preferably set to be movable by an optical lens moving mechanism 72 including a power supply and a driving source. The optical lens 61 may be, of course, set to be movable by a manual operation in place of the electric operation.

As mentioned above, by use of the optical lens 61, the subject 106 can see the optical image displayed on the stimulation output section 119 well even if the subject is a farsighted or shortsighted person.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

We claim:

1. A gradient coil apparatus comprising:

main coils for generating a gradient magnetic fields;

shield coils for generating magnetic fields to reduce leak magnetic fields from said main coils; and a stimulation output section for outputting stimulation to a subject, wherein said main coils are arranged at the outside of an area between said stimulation output section and said subject such that said stimulation can be transmitted to the subject, said stimulation output section and said main coils being provided at the inside of said shield coils.

2. The apparatus according to claim 1, wherein said main coils include at least two coils arranged to be symmetrical about a imaging central surface and to have a predetermined distance, and said stimulation output section is provided between said two coils.

3. The apparatus according to claim 1, wherein said main coils are arranged such that effective current components for forming a magnetic field gradient in a imaging region are distributed at two portions along a direction of a static magnetic field, the two portions are separated with an interval having a predetermined distance, and said stimulation output section is provided in the interval.

4. The apparatus according to claim 1, wherein said stimulation output section has at least one of an optical system, a diode array, a liquid-crystal display and a CRT for displaying an image the subject.

5. The apparatus according to claim 1, wherein said main coils and said shield coils are arranged to ensure linearity of the magnetic field gradient in the imaging region.

6. The apparatus according to claim 1, further comprising a RF shield provided between said main coils and said subject.

7. The apparatus according to claim 6, wherein at least a part of said RF shield is formed of a mesh conductor.

8. The apparatus according to claim 6, wherein at least a part of said RF shield is formed to have a slit.

9. The apparatus according to claim 6, wherein at least a part of said RF shield is formed of a transparent conductor.

10. The apparatus according to claim 1, further comprising transmission path changing means, provided between said stimulation output section and said subject, for changing a transmission path of said stimulation from said stimulation output section to said subject.

11. The apparatus according to claim 10, further comprising sliding means for sliding said transmission path charging means.

12. The apparatus according to claim 10, wherein said transmission path changing means includes one of an optical lens a frenel lens and a miller.

13. A gradient coil apparatus comprising:

main coils for generating a gradient magnetic field;

shield coils for generating a magnetic field to reduce the magnetic field leaked from said main coils; and a stimulation output section for outputting stimulation to a subject, wherein said main coils include two coils arranged to have a predetermined distance along a direction of a static magnetic field, and said stimulation output section is provided between these two coils, said stimulation output section and said main coils being provided at the inside of said shield coils.

14. A gradient coil apparatus comprising:

main coils for generating a gradient magnetic field;

shield coils for generating a magnetic field to reduce the magnetic field leaked from said main coils; and a stimulation output section for outputting stimulation to a subject, wherein said main coils are arranged such that effective current components for forming a magnetic field gradient in an imaging region are distributed at two portions along a direction of a static magnetic field, the two portions are separated with an interval having a predetermined distance, and said stimulation output section is provided in the interval, said stimulation output section and said main coils being provided at the inside of said shield coils.

15. A magnetic resonance imaging apparatus, having a static magnetic field magnet, a gradient coil apparatus, and an RF coil, for imaging an internal portion of a subject by use of a magnetic resonance phenomenon, said gradient coil apparatus comprising main coils for generating gradient magnetic fields; shield coils for generating magnetic fields to reduce leak magnetic fields from said main coils; and a stimulation output section for outputting stimulation to a subject, wherein said main coils are arranged at the outside of an area between said stimulation output section and said subject such that said stimulation can be transmitted to the subject, said stimulation output section and said main coils being provided at the inside of said shield coils.

16. A gradient coil apparatus comprising:

main coils for generating a gradient magnetic fields;

shield coils for generating magnetic fields to reduce leak magnetic fields from said main coils said shield coils being gapless; and a stimulation output section for outputting stimulation to a subject, wherein said main coils are arranged at the outside of an area between said stimulation output section and said subject such that said stimulation can be transmitted to the subject.

17. The apparatus according to claim 16, wherein said main coils include at least two coils arranged to be symmetrical about an imaging central surface and to have a predetermined distance, and said stimulation output section is provided between said two coils.

18. The apparatus according to claim 16, wherein said main coils are arranged such that effective current components for forming a magnetic field gradient in an imaging region are distributed at two portions along a direction of a static magnetic field, the two portions being separated with an interval having a predetermined distance, and said stimulation output section is provided in the interval.

19. The apparatus according to claim 16, wherein said stimulation output section has at least one of an optical system, a diode array, a liquid-crystal display and a CRT configured to display an image the subject.

20. The apparatus according to claim 16, wherein said stimulation output section and said main coils are provided at the inside of said shield coils.

21. The apparatus according to claim 16, wherein said main coils and said shield coils are arranged to ensure linearity of the magnetic field gradient in the imaging region.

22. The apparatus according to claim 16, further comprising a RF shield provided between said main coils and said subject.

23. The apparatus according to claim 22, wherein at least a part of said RF shield is formed of a mesh conductor.

24. The apparatus according to claim 22, wherein at least a part of said RF shield is formed to have a slit.

25. The apparatus according to claim 22, wherein at least a part of said RF shield is formed of a transparent conductor.

26. The apparatus according to claim 16, further comprising a transmission path changing element, provided between said stimulation output section and said subject, configured to change a transmission path of said stimulation from said stimulation output section to said subject.

27. The apparatus according to claim 26, further comprising a sliding element configured to slide said transmission path changing element.

* * * * *